(12) United States Patent
Brattoli et al.

(10) Patent No.: US 8,810,170 B2
(45) Date of Patent: Aug. 19, 2014

(54) METHODS AND APPARATUS FOR ELECTRIC MOTOR CONTROLLER PROTECTION

(71) Applicant: Regal Beloit America, Inc., Beloit, WI (US)

(72) Inventors: Mark A. Brattoli, Fort Wayne, IN (US); Guy Bonner, Jr., Fort Wayne, IN (US)

(73) Assignee: Regal Beloit America, Inc., Beloit, WI (US)

( * ) Notice: Subject to any disclaimer, the term of this patent is extended or adjusted under 35 U.S.C. 154(b) by 0 days.

(21) Appl. No.: 13/734,103

(22) Filed: Jan. 4, 2013

(65) Prior Publication Data
US 2013/0119906 A1 May 16, 2013

Related U.S. Application Data

(63) Continuation of application No. 12/201,486, filed on Aug. 29, 2008, now Pat. No. 8,368,331.

(51) Int. Cl.
| | |
|---|---|
| *H02P 6/16* | (2006.01) |
| *H02P 6/00* | (2006.01) |
| *H02P 6/06* | (2006.01) |
| *H02P 23/00* | (2006.01) |
| *H02P 27/04* | (2006.01) |
| *G01R 21/00* | (2006.01) |
| *H02P 7/288* | (2006.01) |
| *H02P 6/08* | (2006.01) |
| *G01R 21/06* | (2006.01) |

(52) U.S. Cl.
CPC ...... *H02P 6/08* (2013.01); *H02P 6/002* (2013.01); *G01R 21/06* (2013.01)
USPC ............ 318/400.04; 318/400.01; 318/400.05; 318/400.42; 318/700; 318/798; 318/800; 318/801; 318/805; 318/812; 702/60; 388/833

(58) Field of Classification Search
USPC ................. 318/700, 400.01, 400.04, 400.05, 318/400.42, 798, 800, 801, 805, 812; 702/60; 388/833
See application file for complete search history.

(56) References Cited

U.S. PATENT DOCUMENTS

| | | | |
|---|---|---|---|
| 4,558,264 | A | 12/1985 | Weischedel |
| 4,757,241 | A | 7/1988 | Young |

(Continued)

FOREIGN PATENT DOCUMENTS

| | | |
|---|---|---|
| EP | 0945974 A | 9/1999 |
| GB | 1239922 | 7/1971 |

(Continued)

OTHER PUBLICATIONS

First Office Action and Search Report for Chinese Application No. 200910171033.1 dated Feb. 28, 2013, 5 pages, Beijing, CN.

(Continued)

*Primary Examiner* — Eduardo Colon Santana
*Assistant Examiner* — Gabriel Agared
(74) *Attorney, Agent, or Firm* — Armstrong Teasdale LLP (57) ABSTRACT

A method for monitoring input power to an electronically commutated motor (ECM) is described. The method includes determining, with a processing device, an average input current to the motor, the average input current based on a voltage drop across a shunt resistor in series with the motor, measuring an average input voltage applied to the motor utilizing the processing device, multiplying the average input current by the average voltage to determine an approximate input power, and communicating the average input power to an external interface.

18 Claims, 5 Drawing Sheets

(56) References Cited

U.S. PATENT DOCUMENTS

| | | |
|---|---|---|
| 4,763,347 A | 8/1988 | Erdman |
| 4,842,536 A | 6/1989 | Meyrat et al. |
| 5,194,802 A | 3/1993 | Hill et al. |
| 5,486,743 A | 1/1996 | Nagai |
| 5,534,763 A | 7/1996 | Williams et al. |
| 5,604,387 A | 2/1997 | Cheyne |
| 5,818,178 A | 10/1998 | Marumoto et al. |
| 6,218,795 B1 | 4/2001 | Syukuri |
| 6,337,548 B2 | 1/2002 | Kawabata et al. |
| 6,396,225 B1 | 5/2002 | Wakui et al. |
| 6,825,632 B2 | 11/2004 | Hahn et al. |
| 6,850,031 B2 | 2/2005 | Nakata et al. |
| 6,906,484 B1 | 6/2005 | Berroth et al. |
| 7,049,781 B2 | 5/2006 | Maiocchi et al. |
| 7,230,400 B1 | 6/2007 | Dufner et al. |
| 7,304,452 B2 | 12/2007 | Nagai et al. |
| 7,960,929 B2 | 6/2011 | Niikura |
| 2004/0050839 A1 | 3/2004 | Riess et al. |
| 2005/0146903 A1 | 7/2005 | Yang et al. |
| 2006/0132071 A1 | 6/2006 | Oh et al. |
| 2006/0238154 A1* | 10/2006 | Brannen et al. ............... 318/439 |
| 2006/0273752 A1* | 12/2006 | Duarte et al. ................. 318/791 |
| 2007/0222402 A1 | 9/2007 | Hochhausen et al. |
| 2007/0229011 A1* | 10/2007 | Knab et al. .................... 318/434 |
| 2009/0066280 A1* | 3/2009 | Hayashi ........................ 318/430 |

FOREIGN PATENT DOCUMENTS

| | | |
|---|---|---|
| JP | 59083592 A | 5/1984 |
| JP | 2142387 | 5/1990 |
| JP | 2002359991 A | 12/2002 |

OTHER PUBLICATIONS

Extended European Search Report for Regal Beloit Application No. 09167827.6-1809/2159582 mailed May 24, 2013, 6 pages.

\* cited by examiner

METHODS AND APPARATUS FOR ELECTRIC MOTOR CONTROLLER PROTECTION

CROSS-REFERENCE TO RELATED APPLICATIONS

This application is a continuation of U.S. patent application Ser. No. 12/201,486, filed Aug. 29, 2008 titled Methods and Apparatus for Electronically Commutated Motor (ECM) Operation, which is hereby incorporated by reference in its entirety.

BACKGROUND

The field of the disclosure relates generally to electronically commutated motors, and more particularly, to methods and apparatus for average current and input power monitoring in an electronically commutated motors.

Electronically commutated motors (ECMs) are used in a wide variety of applications. ECMs are sometimes referred to in the industry, and herein, as brushless DC motors. One application in which ECMs are deployed is an air flow delivery system. In an airflow delivery system, such as in an evaporator fan unit in a walk-in cooler, it is desirable to know how much power is being used under certain loading conditions to minimize energy usage. This power utilization information can be used to determine when a defrosting cycle is unnecessary or when the system is being under utilized, in order to conserve energy.

Some systems incorporate peak current control circuitry, along with a constant torque algorithm, to determine loading on the motor. The disadvantage to this configuration is that an efficiency estimate must be made in order to calculate the total power input. Generally, this configuration utilizes a lookup table for obtaining the efficiency estimate. Better data can be obtained if a real time power measurement is utilized instead of a lookup table.

BRIEF SUMMARY

In one aspect, a method for monitoring input power to an electronically commutated motor (ECM) is provided. The method includes determining, with a processing device, an average input current to the motor, the average input current based on a voltage drop across a shunt resistor in series with the motor, measuring an average input voltage applied to the motor utilizing the processing device, multiplying the average input current by the average applied voltage to determine an approximate input power, and communicating the average input power to an external interface.

In another aspect, an electronically commutated motor (ECM) is provided. The ECM includes a rotor, a plurality of windings for causing a rotation of the rotor, and an ECM control circuit. The ECM control circuit includes a switching circuit operable to selectively couple the windings to a power source, a shunt resistor in series with the switching circuit, a processing device configured to control the switching circuit, and at least one analog-to-digital converter (ADC) coupled to the processing device. The processing device is configured to control operation of the ADC such that that an average input current to the motor can be determined based on a voltage drop across the shunt resistor and an average input voltage applied to the motor can be measured using a resistive voltage divider.

The features, functions, and advantages that have been discussed can be achieved independently in various embodiments of the present invention or may be combined in yet other embodiments further details of which can be seen with reference to the following description and drawings.

DETAILED DESCRIPTION

Figure 1:
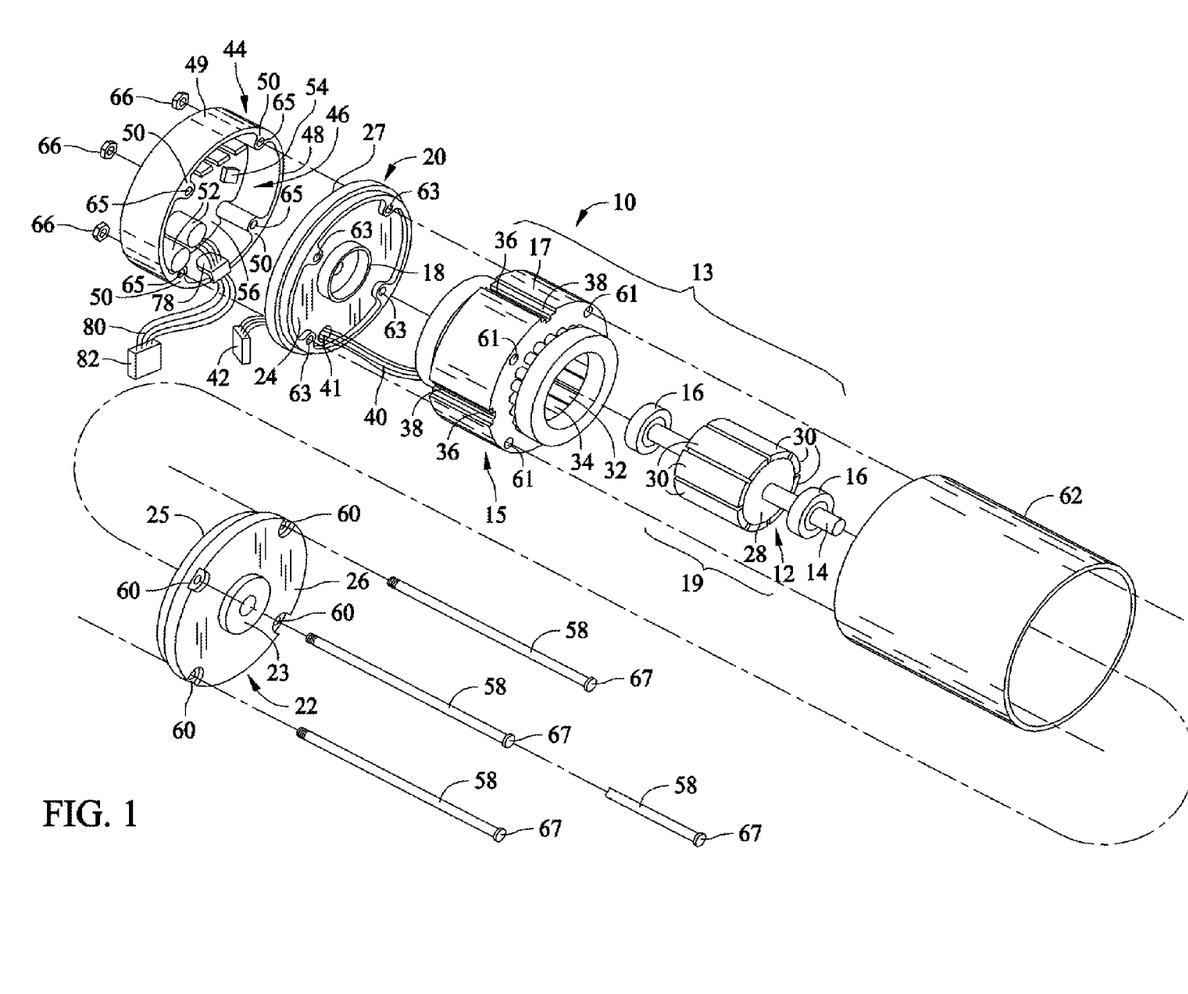
FIG. 1 is an exploded view of an integrated electronically commutated motor (ECM) and control circuit assembly.
Figure 2:
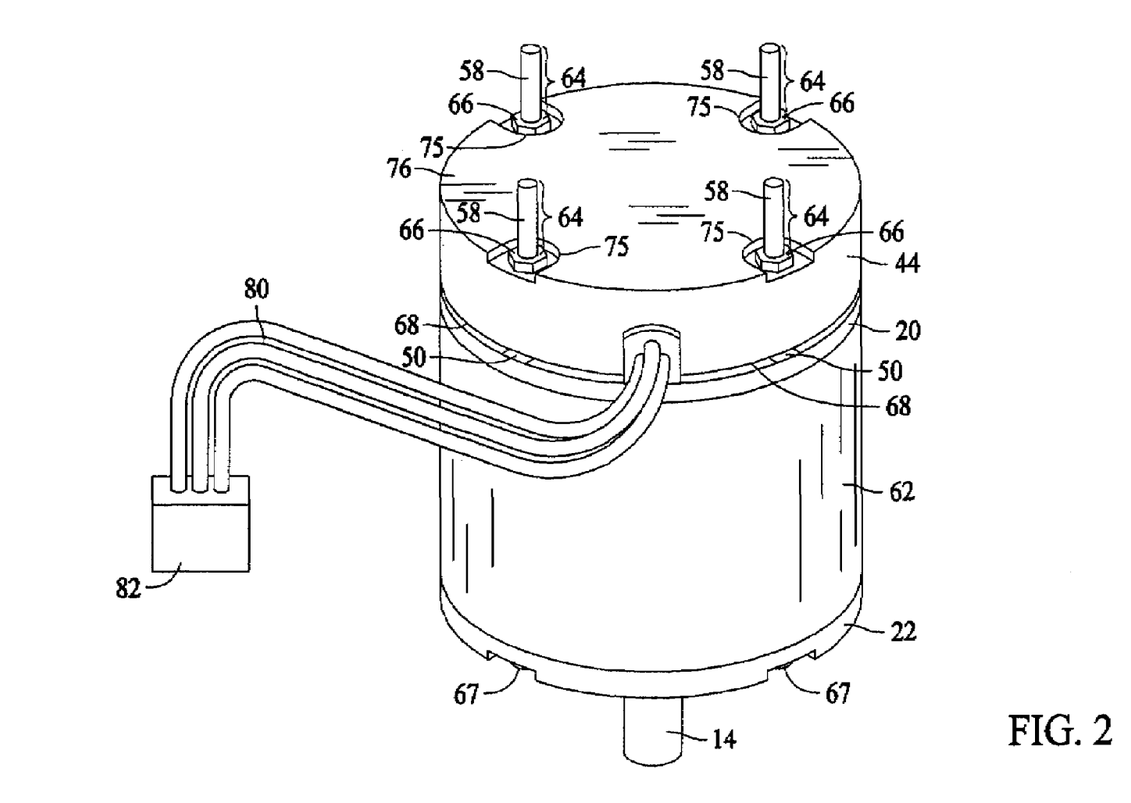
FIG. 2 is a fully assembled view of the ECM and control circuit assembly of FIG. 1.

Referring to the drawings, and more particularly to FIGS. 1 and 2, reference character 10 generally designates an integrated electronically commutated motor and control circuit assembly. Motor assembly 10 comprises a brushless electronically commutated DC motor 13 having a stationary assembly 15 including a stator or core 17 and a rotatable assembly 19 including a permanent magnet rotor 12 and a shaft 14. A fan (not shown) or other means to be driven such as means for moving air through an air handling system engages the shaft 14. Specifically, motor assembly 10 is for use in combination with an air handling system such as an air conditioning system including a fan for blowing air over cooling coils for supplying the cooled air to a building.

Rotor 12 is mounted on and keyed to the shaft 14 journaled for rotation in conventional bearings 16. The bearings 16 are mounted in bearing supports 18 integral with a first end member 20 and a second end member 22. The end members 20 and 22 are substantially flat and parallel to each other. The end members 20 and 22 have inner facing sides 24, 25 between which the stationary assembly 15 and the rotatable assembly 19 are located. Each end member 20 and 22 has an outer side 26, 27 opposite its inner side 24, 25. Additionally, second end member 22 has an aperture 23 for the shaft 14 to pass through and extend out from the outer side 26.

The rotor 12 comprises a ferromagnetic core 28 and is rotatable within the bore of stator 17. Eight essentially identical magnetic material elements or relatively thin arcuate segments 30 of permanent magnet material, each providing a relatively constant flux field, are secured, for example, by adhesive bonding to rotor core 28. The segments 30 are magnetized to be polarized radially in relation to the rotor core 28 with adjacent segments 30 being alternately polarized as indicated. While magnets 30 on rotor 12 are illustrated for purposes of disclosure, it is contemplated that other rotors having different constructions and other magnets different in both number, construction, and flux fields may be utilized with such other rotors so as to meet at least some of the objects thereof.

Stationary assembly 15 comprises a plurality of winding stages 32 adapted to be electrically energized to generate an electromagnetic field. Stages 32 are coils of wire wound around teeth 34 of the laminated stator core 17. The core 17 may be held together by four retainer clips 36, one positioned within each notch 38 in the outer surface of the core 17. Alternatively, the core 17 may be held together by other suitable means, such as for instance welding or adhesively bonding, or merely held together by the windings, all as will be understood by those skilled in the art. The winding end turns extend beyond the stator end faces and winding terminal leads 40 are brought out through an aperture 41 in the first end member 20 terminating in a connector 42. While stationary assembly 15 is illustrated for purposes of disclosure, it is contemplated that other stationary assemblies of various other constructions having different shapes and with different number of teeth may be utilized within the scope of the invention so as to meet at least some of the objects thereof.

Motor assembly 10 further includes a cap 44 which is mounted on the rear portion of the motor assembly 10 to enclose within the cap 44 control means 46 for the motor 13. The cap 44 includes an edge 48 having a plurality of spacing elements 50 projecting therefrom which engage the outer side 27 of the first end member 20. Cap 44 includes a substantially annular side wall 49 with the top of the side wall 49 forming edge 48. The control means 46 is positioned adjacent the outer side 27 of the first end member 20. The control means 46 includes a plurality of electronic components 52 and a connector (not shown) mounted on a component board 56, such as a printed circuit board. The control means 46 is connected to the winding stages 32 by interconnecting connector 42 and connector 54. The control means 46 applies a voltage to one or more of the winding stages 32 at a time for commutating the winding stages 32 in a preselected sequence to rotate the rotatable assembly 19 about an axis of rotation.

Connecting elements 58 comprising a plurality of bolts pass through bolt holes 60 in the second end member 22, bolt holes 61 in core 17, bolt holes 63 in first end member 20, and bolt holes 65 in cap 44. The head 67 of the connecting elements 58 engage the second end member 22. The connecting elements 58 are adapted to urge the second end member 22 and the cap 44 toward each other thereby supporting the first end member 20, the stationary assembly 15, and the rotatable assembly 19 therebetween. Additionally, a housing 62 may be positioned between the first end member 20 and the second end member 22 for enclosing and protecting the stationary assembly 15 and the rotatable assembly 10.

Electronically commutated motor 13 as described herein merely for purposes of disclosure is an eight rotor-pole motor, but it will be understood that the electronically commutated motor of this invention may include any even number of rotor poles and the number of stator poles are a multiple of the number of rotor poles, for example, the number of stator poles may be based on the number of phases. In one exemplary embodiment not shown in the Figures, a three-phase ECM includes six rotor pole pairs and 18 stator poles.

The motor assembly 10 according to the invention operates in the following manner. When the winding stages 32 are energized in a temporal sequence three sets of eight magnetic poles are established that will provide a radial magnetic field which moves clockwise or counterclockwise around the core 17 depending on the preselected sequence or order in which the stages are energized. This moving field intersects with the flux field of the magnet 30 poles to cause the rotor to rotate relative to the core 17 in the desired direction to develop a torque which is a direct function of the intensities or strengths of the magnetic fields.

The winding stages 32 are commutated without brushes by sensing the rotational position of the rotatable assembly 19 as it rotates within the core 17 and utilizing electrical signals generated as a function of the rotational position of the rotor 12 sequentially to apply a DC voltage to each of the winding stages 32 in different preselected orders or sequences that determine the direction of the rotation of the rotor 12. Position sensing may be accomplished by a position-detecting circuit responsive to the back electromotive force (BEMF) to provide a simulated signal indicative of the rotational position of the rotor 12 to control the timed sequential application of voltage to the winding stages 32 of the motor 13. Other means of position sensing may also be used.

FIG. 2 illustrates the fully assembled motor assembly 10. Connecting elements 58 pass through the second end member 22, the stationary assembly 15, the first end member 20, and the cap 44. The connecting elements 58 have a portion 64 which projects laterally from the cap 44. Portion 64 is adapted to engage a support structure (not shown) for supporting the motor assembly 10. The connecting elements 58 may be secured in place by placing a nut 66 engaging the threads on each of the portions 64 of the connecting elements 58. A wiring harness 80 and connector 82 are utilized to connect motor assembly 10 to an electrical power source as further described below.

Spacing elements 50 when engageable with the outer side 27 of the first end member 20 form air gaps 68 between the spacing elements 50, the edge 48, and the outer side 27. The air gaps 68 permit flow through the cap 44 thereby dissipating heat generated by the motor assembly 10. Additionally, if the motor assembly 10 is exposed to rain the air gaps 68 permit rain which has entered the cap 44 to flow out of the cap 44 via the air gaps 68.

Indentations 75 are formed in a bottom 76 of the cap 44 which provide a space for a tool (not shown) to fit in to tighten the nuts 66. The indentations 75 also allow the nuts 66 to be mounted on the connecting elements 58 flush with the bottom 76 of the cap 44.

Figure 3:
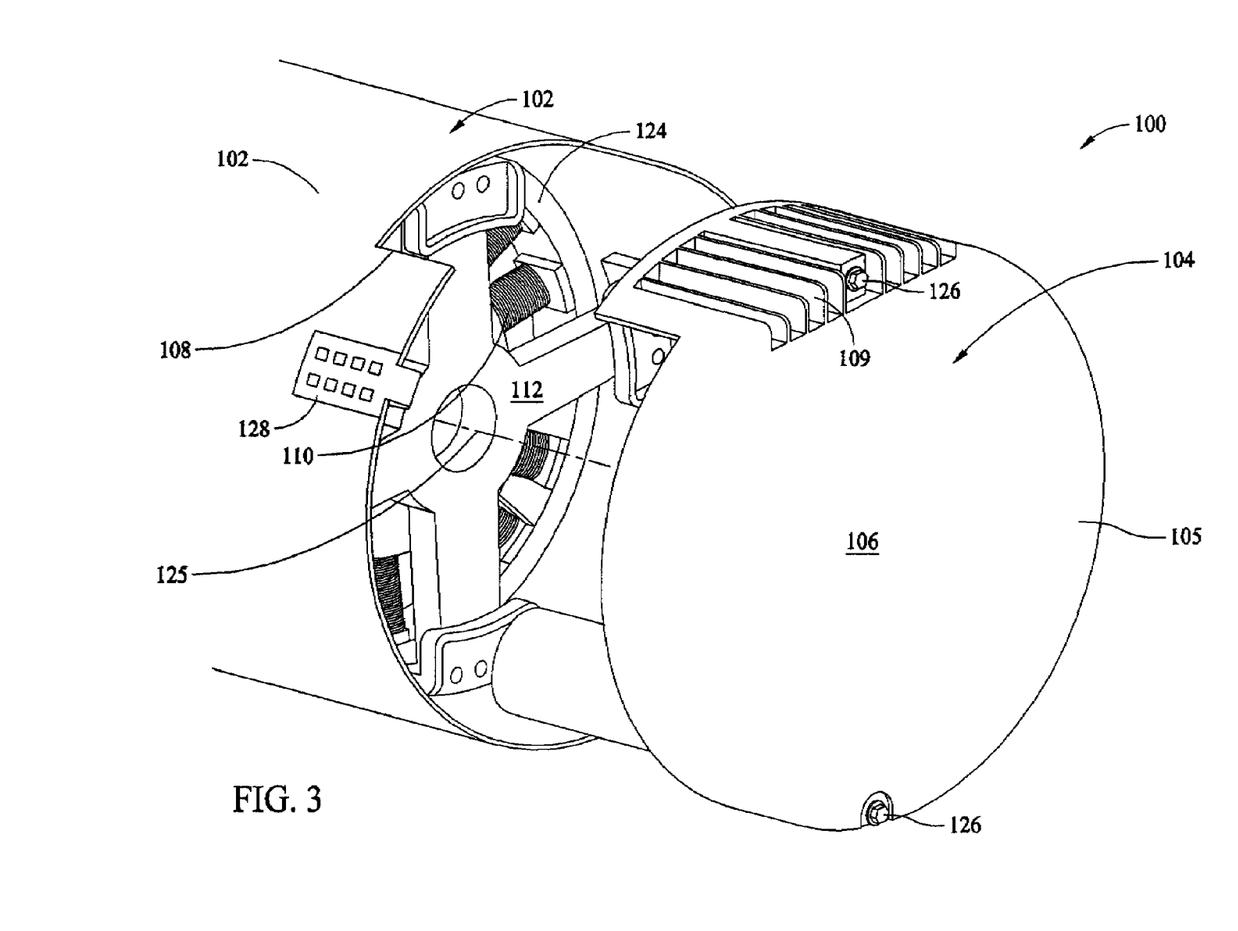
FIG. 3 is an exploded end view of an alternative embodiment for an ECM.

FIG. 3 is an exploded end view of an alternative embodiment for an ECM 100. Motor 100 includes a motor enclosure 102 and a motor control unit 104 configured for attachment to motor enclosure 102. A chassis 105 of motor control unit 104 serves as an end shield 106 for motor 100. Motor enclosure 102 also includes a slot 108 which engages a heat sink 109 formed in chassis 105 as further described below. While motor control unit 104 includes chassis 105, motor 100 is configured such that motor enclosure 102 provides substantially all of the enclosure for motor control unit 104. Within motor enclosure 102 are windings 110 of motor 100 and a mid shield 112 configured for placement between windings 110 and motor control unit 104.

The placement and configuration of mid shield 112 allows motor control unit 104 of motor 100 to be removed and replaced without disruption or displacement of a motor winding assembly 124 which includes windings 110 of motor 100. As illustrated, motor enclosure 102 is configured to form a part of the enclosure for motor control unit 104, along with end shield 106, allowing for a one-piece enclosure configuration. Mid shield 112 is also configured to meet any airflow, voltage clearances and assembly height limitations imposed on motor 100.

In one embodiment, as illustrated, mid shield 112 fits precisely with respect to a centerline 125 of motor 100 and further aligns with two bolts 126 that pass through end shield 106 of motor control unit 104 to clamp and secure mid shield 112 and motor control unit 104 within motor enclosure 102. This alignment and symmetry remain even when chassis 105 containing the electronics of motor control unit 104 is removed. Retaining the alignment and symmetry within enclosure 102 is important as it lowers a replacement cost of motor control unit 104 in the field. Mid shield 112 also contributes to a lower material cost for motor 100, because with mid shield 112, motor enclosure 102 is utilized as a part of the containment enclosure for portions of motor control unit 104 as shown in FIG. 3, decreasing the size of motor 100 as compared to motor 11 (shown in FIGS. 1 and 2). Additionally, such a configuration allows for a placement of a power connector 128 that is flush with chassis 102.

Utilization of mid shield 112 allows motor control unit 104 to be removed from enclosure 102 without disturbing the rest of the motor assembly, for example, windings 110. The non-disturbance is obtained by using mid shield 112 to secure a bearing that engages a motor shaft (neither shown in FIG. 1) of motor 100. Therefore, enclosure 102 is additionally configured to provide any required clearances for the electrical components (e.g., motor control unit 104) of motor 100 to allow disengagement of motor control unit 104 from motor 100.

With regard to one of the embodiments described herein, the current delivered to the brushless DC motor 10 (100) is averaged by an integrator circuit whose output is coupled to an analog to digital converter (ADC) whose output data is routed to a processing device. In another embodiment, the integrator circuit output is routed to an ADC input on a microcontroller. Either embodiment allows the average power delivered to the motor to be easily calculated when the average applied motor voltage which is also an analog to digital converter input to the microcontroller, is multiplied by the current. The average power delivered to the motor can be used as an indication in an airflow delivery system to control the amount of power used by the system for energy conservation purposes. As mentioned above, current systems use peak current control, along with a constant torque algorithm, to determine the loading on the motor from where an efficiency estimate must be made in order to calculate the total power input.

The described embodiments use real time power input monitoring as opposed to an estimate. Such a method also allows an internal maximum power limit to be set for protection of the microcontroller/microprocessor for increased reliability. Expressed in alternative terms, a wattmeter function is available to both the end user of the motor for energy conservation purposes, and to the control designer to enhance the reliability of his product. The advantage of the embodiments is a built-in power usage function in a brushless DC motor where the end user can interrogate the motor via a digital serial interface to determine power usage. Additionally, the end user can develop a system controller which can optimize energy conservation based on the power usage information.

Figure 4:
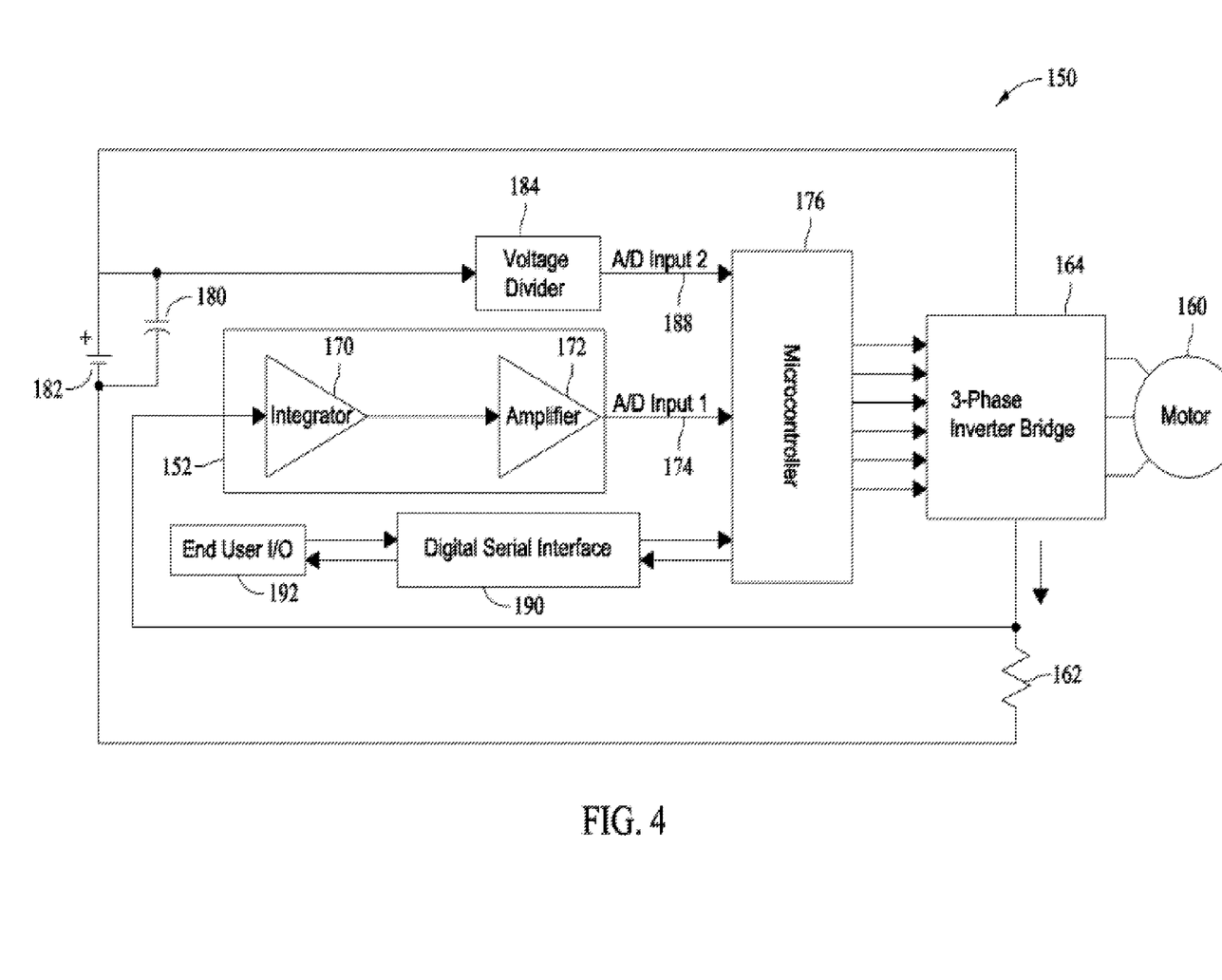
FIG. 4 is a functional block diagram of one embodiment of an ECM controller, the controller including an average input current monitoring capability.

FIG. 4 is a functional block diagram of one embodiment of ECM controller that includes an average current monitoring circuit 150. The average current monitoring circuit 150 can be utilized with motors 10 and 100 described above. Specifically, the current monitoring circuit 150 includes a dual-stage operational amplifier (Op Amp) 152, with a first stage integrator 170, and a second stage amplifier 172. The current delivered to the motor 160 is delivered through shunt resistor 162. The peak value of motor current is controlled by pulse width modulating the six power switches in the three-phase inverter bridge, 164. The voltage drop across the shunt resistor 162 is the motor current multiplied by the resistance value of shunt resistor 162. This voltage drop is input to integrator 170 which averages the voltage drop across the shunt resistor 162 according to:

$$\frac{-1}{RC}\int v\,dt,$$

where "v" is the voltage across the shunt resistor 162 and "RC" is the time constant of the integrator 170.

The output of the integrator 170 is amplified by amplifier 172. In the illustrated embodiment, amplification is necessary to provide the proper voltage level for the analog to digital (A/D) input 174 on the microcontroller 176. This voltage level is in the range of 0 to +4.5V and is directly proportional to the output of the first stage integrator 170. Since the output of the first stage integrator 170 is the average voltage across shunt resistor 162, and the voltage across the shunt resistor 162 is directly proportional to the motor current, it follows that the voltage level appearing at A/D input 174 is directly proportional to the average current delivered to the motor. In order to calculate the input power, the average current delivered to the motor multiplied by the voltage applied to the motor 160. If the applied motor voltage is from a DC source, then the input power is the DC voltage multiplied by the average current delivered to the motor.

However, when the applied motor voltage is from an AC source, the applied voltage is a function of time and the level of motor current. In such configurations, the AC input voltage source is typically rectified by a bridge rectifier (not shown) and filtered by a capacitor 180, for example an aluminum electrolytic capacitor, to form a DC voltage supply 182 that can be utilized by the motor 160. The illustrated embodiment operates to average the divided down voltage on the filter capacitor 180. More specifically, a voltage divider 184 proportionally reduces the high voltage on the filter capacitor 180 to a level which can be read by a second A/D input 188 on the microcontroller 176. The voltage that is read by the microcontroller 176 is averaged over a fixed time interval, resulting in an average voltage.

This average voltage is then multiplied by the average current read from the first A/D input 174 by the microcontroller 176. The resulting output is approximately the input power delivered to the motor 160. The resulting input power measurement is communicated to external devices via a digital serial interface (DSI) 190 upon request from an end user I/O device 192.

Figure 5:
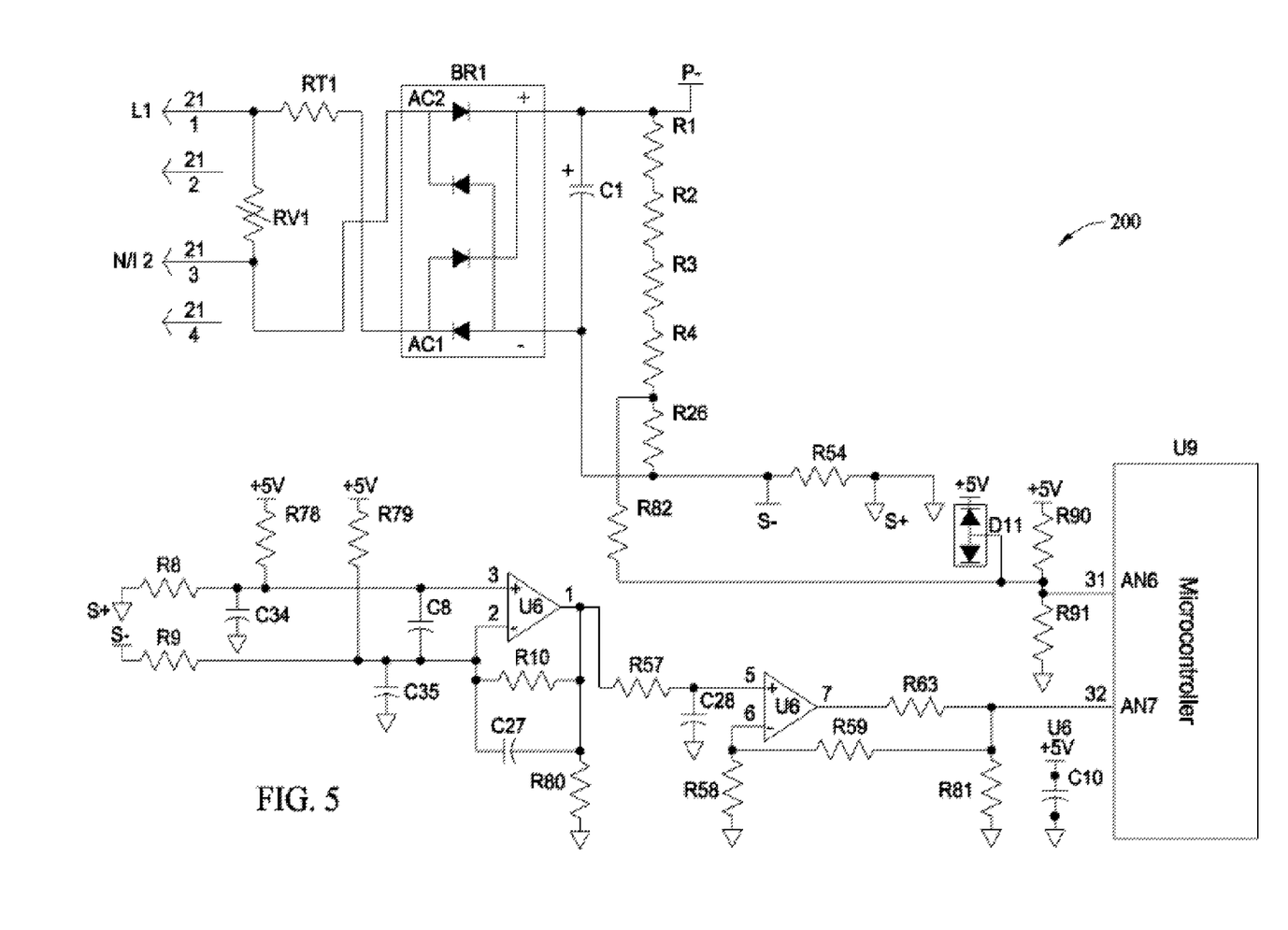
FIG. 5 is a detailed schematic diagram of an average input current monitoring circuit.

FIG. 5 is a detailed schematic diagram 200 of one specific embodiment of the above described circuit 150. The average current detector consists of a two-stage Op Amp U6. The first stage is the described integrator which includes the time constant determining R9 and C27, a gain setting resistor R10, offset bias resistors R78 and R79, and high frequency noise filtering capacitors C8, C34, and C35. R54 is the shunt resistor through which the motor current flows. R8 and R9 couple the voltage across the shunt resistor R54 to the first stage integrator. The second stage is an amplifier with a gain set by R59 and R58. R57 is an input balancing resistor, and resistors R81 and R83 are loading resistors. The voltage sensing circuit has a voltage divider formed by R1, R2, R3, R4, and R26. R82 is a coupling resistor, and R90 and R91 are bias resistors. D11 is a clamping diode to protect the microcontroller U9 from voltage spikes. Microcontroller U9 has two A/D input ports, AN7 which reads the average motor current, and AN6 which reads the average voltage applied to the motor. BR1 is a diode bridge which rectifies the AC input voltage, and capacitor C1 filters the rectified voltage into a DC voltage.

The subject matter of the present disclosure is described with specificity herein to meet statutory requirements. However, the description itself is not intended to limit the scope of this patent. Rather, it has been contemplated that the claimed subject matter might also be embodied in other ways, to include different steps or combinations of steps similar to the ones described in this document, in conjunction with other present or future technologies. Moreover, although the terms "step," "block," and/or "operation" may be used herein to connote different elements of methods employed, the terms should not be interpreted as implying any particular order among or between various steps herein disclosed unless and except when the order of individual steps is explicitly described.

This written description uses examples to disclose the described embodiments, including the best mode, and also to enable any person skilled in the art to practice the described embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of protecting a motor controller of an electric motor, said method comprising:
   determining, with a processing device, an average input current to the motor based on a voltage drop across a shunt resistor in series with the motor by integrating the voltage dropped across the shunt resistor with respect to time using an integrator and apply the integrated voltage to an analog-to-digital converter; and
   measuring at least one voltage;
   determining, with the processing device, an average input voltage applied to the motor based on the at least one measured voltage;
   multiplying the average input current by the average input voltage to determine an average input power; and
   setting a maximum power limit for the motor controller based on the average input power.

2. A method in accordance with claim 1, further comprising maintaining the average input power below the maximum power limit.

3. A method in accordance with claim 2, wherein maintaining the average input power below the maximum power limit comprises controlling the amount of current delivered to the motor.

4. A method in accordance with claim 3, wherein controlling the amount of current delivered to the motor comprises pulse width modulating at least one power switch included in an inverter coupled to the motor.

5. A method in accordance with claim 1, further comprising using the determined average input power as an indication in an airflow delivery system to control the amount of power delivered to a fan.

6. A method in accordance with claim 1, further comprising using the determined average input power as an indication in an airflow delivery system to control the amount of power used by the system.

7. A method in accordance with claim 1, wherein determining an average input voltage applied to the motor based on the at least one measured voltage comprises:
   rectifying and filtering an alternating current (AC) input voltage applied to the motor;
   proportionally voltage dividing the rectified and filtered AC input voltage to a level compatible with an analog-to-digital converter; and
   averaging multiple readings of the divided voltage over a fixed time interval to determine the average input voltage.

8. A method in accordance with claim 1, wherein determining an average input voltage applied to the motor based on the at least one measured voltage comprises:
   proportionally voltage dividing a direct current (DC) input voltage to a level compatible with an analog-to-digital converter; and
   averaging multiple readings of the divided voltage over a fixed time interval to determine the average input voltage.

9. A method in accordance with claim 1, wherein determining an average input current to the motor comprises applying the voltage dropped across the shunt resistor to an analog-to-digital converter.

10. A method in accordance with claim 1, wherein:
    integrating the voltage dropped across the shunt resistor comprises averaging the voltage drop across the shunt resistor according to: $-1/RC \int vdt$, where "v" is the voltage across the shunt resistor and "RC" is the time constant of the integrator; and
    applying the integrated voltage to an analog-to-digital converter comprises amplifying the output of the integrator to provide a proper voltage level for an input of the analog to digital converter.

11. A method in accordance with claim 1, further comprising communicating the average input power to an external interface.

12. A method in accordance with claim 11, wherein communicating the average input power to an external interface comprises transmitting the average input power to at least one external device via a digital serial interface.

13. A method in accordance with claim 12 wherein the average input power is transmitted upon request from an end user I/O device.

14. An electric motor comprising:
    a rotor;
    a plurality of windings for causing a rotation of said rotor; and
    a motor control circuit comprising:
    a switching circuit operable to selectively couple said windings to a power source;
    a shunt resistor in series with said switching circuit; and
    a processing device programmed to:
    determine an average input current to said motor based on a voltage drop across said shunt resistor by integrating the voltage dropped across said shunt resistor with respect to time using an integrator and apply the integrated voltage to an analog-to-digital converter;
    determine an average input voltage applied to said motor based on at least one voltage measurement;
    multiply the average input current by the average input voltage to determine an average input power; and
    set a maximum power limit for said motor control circuit based on the average input power.

15. An electric motor in accordance with claim 14, wherein said processing device is further programmed to maintain the average input power below the maximum power limit by controlling the amount of current delivered to said motor.

16. An electric motor in accordance with claim 14, wherein said processing device is further programmed to use the determined average input power as an indication in an airflow delivery system to control the amount of power delivered to a fan.

17. An electric motor in accordance with claim 14, wherein said motor control circuit further comprises at least one analog-to-digital converter coupled to said processing device, wherein to determine the average input current, said processing device is programmed to apply the voltage dropped across said shunt resistor to said analog-to-digital converter.

18. An electric motor in accordance with claim 14, wherein to integrate the voltage drop across said shunt resistor, said processing device is programmed to:
- integrate the voltage drop across said shunt resistor according to: $-1/RC \int v \, dt$, where "v" is the voltage across said shunt resistor and "RC" is the time constant of said integrator; and
- apply the integrated voltage to said analog-to-digital converter by amplifying an output of said integrator to provide a proper voltage level for an input of said analog-to-digital converter.

* * * * *